(12) United States Patent
Park et al.

(10) Patent No.: US 9,293,672 B2
(45) Date of Patent: Mar. 22, 2016

(54) LIGHT EMITTING DEVICE PACKAGE

(71) Applicant: LG INNOTEK CO., LTD., Seoul (KR)

(72) Inventors: Su Ik Park, Seoul (KR); Hyun Soo Lim, Seoul (KR); Ho Sang Kwack, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/381,057

(22) PCT Filed: Feb. 26, 2013

(86) PCT No.: PCT/KR2013/001549
§ 371 (c)(1),
(2) Date: Aug. 26, 2014

(87) PCT Pub. No.: WO2013/129820
PCT Pub. Date: Sep. 6, 2013

(65) Prior Publication Data
US 2015/0014731 A1     Jan. 15, 2015

(30) Foreign Application Priority Data
Feb. 27, 2012    (KR) .................. 10-2012-0019852

(51) Int. Cl.
*H01L 33/60*    (2010.01)
*H01L 25/16*    (2006.01)
(Continued)

(52) U.S. Cl.
CPC .............. *H01L 33/60* (2013.01); *H01L 25/167* (2013.01); *H01L 33/48* (2013.01); *H01L 33/62* (2013.01); *H01L 2224/48091* (2013.01); *H01L 2224/49109* (2013.01); *H01L 2924/1301* (2013.01)

(58) Field of Classification Search
CPC .................. H01L 25/167; H01L 2224/48091; H01L 2224/49109; H01L 2924/00014; H01L 33/60; H01L 33/62; H01L 33/48; H01L 33/52
USPC ........... 257/98, 676, E25.032; 438/FOR. 157, 438/FOR. 287
See application file for complete search history.

(56) References Cited

U.S. PATENT DOCUMENTS 7,696,590 B2    4/2010    Waitl et al.
8,530,925 B2 *  9/2013    Kim ................................. 257/99
(Continued)

FOREIGN PATENT DOCUMENTS

CN    201 556 617 U    8/2010
CN    102 054 829 A    5/2011
(Continued)

OTHER PUBLICATIONS

International Search Report dated Jun. 27, 2013 issued in Application No. PCT/KR2013/001549.
(Continued)

*Primary Examiner* — Armando Rodriguez
(74) *Attorney, Agent, or Firm* — KED & Associates LLP

(57) ABSTRACT

A light emitting device package includes: a package body having a first cavity; an electrode layer comprising a first electrode and a second electrode which are electrically isolated from each other; a light emitting device electrically connected to the electrode layer on the package body; a protective device disposed in a second cavity formed at the package body and electrically connected to the electrode layer; a reflective layer on the protective device; and a molding part on the light emitting device, wherein at least one of the first electrode and the second electrode is disposed on the package body.

21 Claims, 5 Drawing Sheets

(51) Int. Cl.
*H01L 33/48* (2010.01)
*H01L 33/62* (2010.01)

(56) References Cited

U.S. PATENT DOCUMENTS

| | | | |
|---|---|---|---|
| 8,648,365 B2 * | 2/2014 | Won | 257/98 |
| 2008/0012125 A1 | 1/2008 | Son | 257/724 |
| 2008/0296592 A1 | 12/2008 | Osamu | |
| 2009/0200570 A1 | 8/2009 | Mori et al. | |
| 2010/0059782 A1 * | 3/2010 | Fujitomo et al. | 257/98 |
| 2010/0308352 A1 | 12/2010 | Liao et al. | 257/89 |
| 2011/0001156 A1 | 1/2011 | Matsuda et al. | 257/98 |
| 2011/0012144 A1 * | 1/2011 | An | 257/91 |
| 2011/0012151 A1 * | 1/2011 | Ono | H01L 25/167 257/98 |
| 2011/0057209 A1 * | 3/2011 | Kim | 257/88 |
| 2011/0291150 A1 | 12/2011 | Lin et al. | |
| 2012/0056217 A1 * | 3/2012 | Jung et al. | 257/89 |
| 2012/0112222 A1 | 5/2012 | Ha | |
| 2013/0062632 A1 * | 3/2013 | Lee | 257/88 |

FOREIGN PATENT DOCUMENTS

| | | |
|---|---|---|
| CN | 102 064 172 A | 5/2011 |
| JP | 2007-150229 A | 6/2007 |
| JP | 2009 194026 A | 8/2009 |
| KR | 10-0769720 B1 | 10/2007 |
| KR | 2009 0047879 A | 5/2009 |

OTHER PUBLICATIONS

Supplementary European Search Report for Application EP 13 75 4120 dated Aug. 31, 2015.

* cited by examiner

LIGHT EMITTING DEVICE PACKAGE

CROSS-REFERENCE TO RELATED PATENT APPLICATIONS

This application is a U.S National Stage Application under 35 U.S.C. 5371 of PCT Application No. PCT/KR2013/001549, filed Feb. 26, 2013, which claims priority to Korean Patent Application No. 10-2012-0019852, filed Feb. 27, 2012, whose entire disclosures are hereby incorporated by reference.

TECHNICAL FIELD

The embodiment relates to a light emitting device package and a lighting system.

BACKGROUND ART

An LED (Light Emitting Device) is a semiconductor device to convert electrical energy into light energy and can reproduce light of various wavelengths such as red, green, blue, and ultraviolet by controlling a composition of a compound semiconductor, and can emit white light by using a fluorescent material or combining colors with each other.

When comparing with conventional light sources such as a fluorescent lamp, and an incandescent lamp, the semiconductor light emitting device has advantages such as low power consumption, a semi-permanent life span, a rapid response speed, safety, and an eco-friendly property. The application of the semiconductor light emitting device is expanded to a light emitting diode backlight serving as a substitute for a CCFL (Cold Cathode Fluorescence Lamp) constituting a backlight of an LCD (Liquid Crystal Display), a white light emitting diode lighting device serving as a substitute for the fluorescent lamp or the incandescent lamp, a vehicle headlight, and a signal lamp.

In a light emitting device package according to the related art, a light emitting device is mounted on a package body, and an electrode layer is formed on the package body so as to be electrically connected to the light emitting device. Further, a molding part having a luminescence material is formed on the light emitting device.

The light emitting device according to the related art is weak against electrostatic discharge (ESD). In order to complement the above weakness, a zener diode is mounted together with an LED chip to prevent the ESD.

However, the zener diode mounted on an electrode together with the LED chip in order to improve ESD characteristics absorbs a part of light emitted from the LED chip so that light efficiency is lowered.

For example, according to the related art, the zener diode to prevent the ESD is manufactured by using silicon. Since an energy bandgap of the silicon is about 1.12 eV and the energy of a photon emitted from UV~Visible (200 nm-680 nm) LED is in the range of about 1.8 eV to about 6.2 eV significantly higher than the energy bandgap of the silicon, the zener diode having the small energy bandgap absorbs a large amount of light so that light extraction efficiency is lowered.

Moreover, according to the related art, a part of light emitted from the LED chip is absorbed in an electrode exposed on the package body so that the light extraction efficiency is lowered.

DISCLOSURE OF INVENTION

Technical Problem

The embodiment provides a light emitting device package capable of improving light extraction efficiency, and a lighting system.

Solution to Problem

According to the embodiment, there is provided a light emitting device package including: a package body comprising a first cavity; an electrode layer comprising a first electrode and a second electrode which are electrically isolated from each other; a light emitting device electrically connected to the electrode layer on the package body; a protective device disposed in a second cavity formed at the package body and electrically connected to the electrode layer; a reflective layer on the protective device; and a molding part on the light emitting device, wherein at least one of the first electrode and the second electrode is disposed on the package body.

Advantageous Effects of Invention

According to the light emitting device package and the lighting system of the embodiment, light extraction efficiency can be improved by preventing light emitted from the light emitting chip from being absorbed in the protective device and/or the electrode layer.

MODE FOR THE INVENTION

Hereinafter, a light emitting device package according to an embodiment will be described in detail with reference to accompanying drawings.

In the description of embodiments, it will be understood that when a layer (or film) is referred to as being on another layer or substrate, it can be directly on another layer or substrate, or intervening layers may also be present. Further, it will be understood that when a layer is referred to as being under another layer, it can be directly under another layer, and one or more intervening layers may also be present. In addition, it will also be understood that when a layer is referred to as being between two layers, it can be the only layer between the two layers, or one or more intervening layers may also be present.

Embodiment

Figure 1:
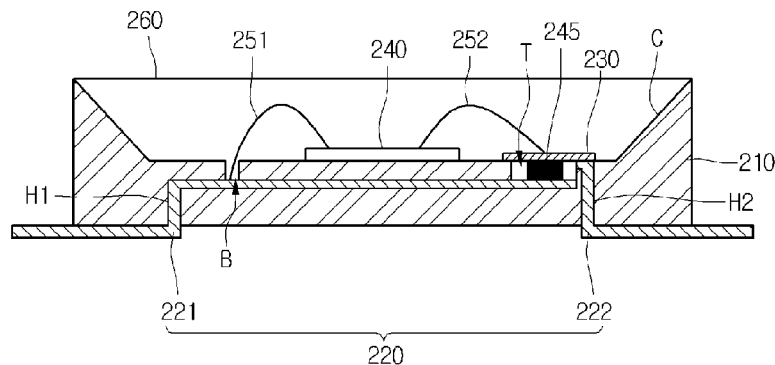
FIG. 1 is a sectional view showing a light emitting device package according to a first embodiment.
Figure 2:
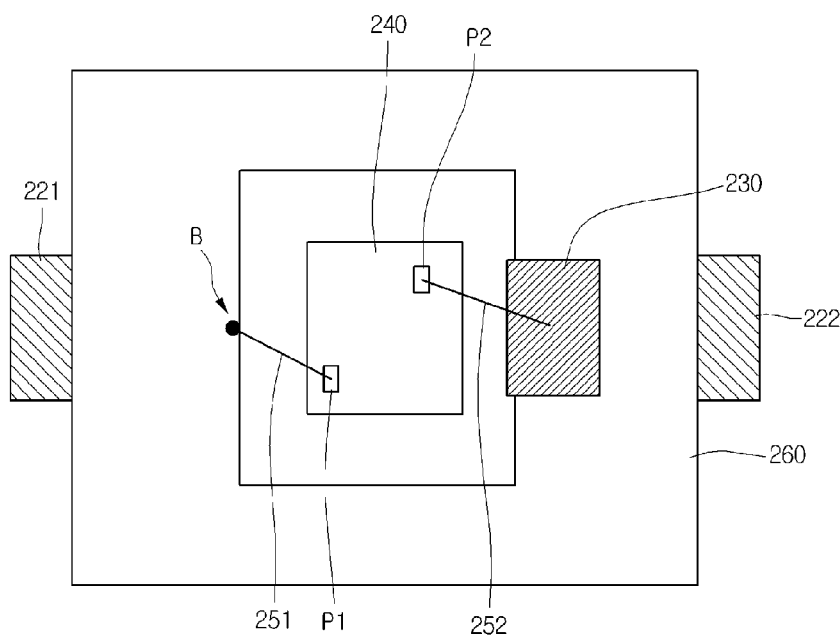
FIG. 2 is a plan view showing a light emitting device package according to the first embodiment.

FIG. 1 is a sectional view showing a light emitting device package 200 according to a first embodiment, and FIG. 2 is a plan view showing the light emitting device package where a molding part 260 is omitted from the light emitting device package 200 according to the first embodiment.

The light emitting device package according to the first embodiment may include an electrode layer 220 disposed on a package body 210 with a first electrode 221 and a second electrode 222 electrically isolated from each other, a light emitting chip 240 electrically connected to the electrode layer 220, a protective device 245 electrically connected to the electrode layer 220 on the package body 210, a reflective layer 230 on the protective device 245, and a molding part 260 on the light emitting chip 240.

FIG. 1 illustrates that the light emitting chip 240 may be a horizontal light emitting device, but the embodiment is not limited thereto.

The package body 210 may include a material representing high reflectance. For example, the package body 210 may have reflectance of at least 95%. Accordingly, even if a separate reflective layer is not formed at a first cavity of the package body 210, light extraction efficiency may be improved.

The package body 210 may include at least one of PPA (Polyphthalamide), Poly-cyclo-hecylene Dimethyl Terephthalate, a white Silicone, and a white EMC (Epoxy Molding Compound), but the embodiment is not limited thereto. Further, the package body 210 may include a ceramic material.

The package body 210 may have various shapes such as a rectangular shape, a triangular shape, a polygonal shape, a circular shape, or a curved shape when viewed from the top. The package body 210 may include a plurality of lateral sides, in which at least one of the lateral sides is vertical or inclined to a bottom surface of the package body 210.

The package body 210 may include a cavity wall protruding upward from one surface in which a first cavity C is placed.

The package body 210 may include the first cavity C defined by an open upper portion, a lateral side, and a bottom. The first cavity C may have a cup shape, a cavity shape, or a recess shape concaved down from the top surface of the package body 210, but the embodiment is not limited thereto. An external surface of the first cavity C may be vertical or inclined to a bottom surface. The first cavity C may have a circular shape, an elliptical shape, a polygonal shape (for example, rectangular shape), a polygonal shape having curved edges, but the embodiment is not limited thereto.

The light emitting chip 240 may selectively emit the light having a predetermined wavelength in the range of an ultraviolet ray band to a visible ray band. For instance, the light emitting device 100 may be selected from a red LED chip, a blue LED chip, a green LED chip, a yellow green LED chip, a UV LED chip, or a white LED chip.

For example, the light emitting chip 240 may include a light emitting structure (not shown) disposed on a substrate (not shown), and the light emitting structure may include a first conductive semiconductor layer, an active layer, and a second conductive semiconductor layer.

The light emitting chip 240 includes a group III-V compound semiconductor light emitting device or a group II-VI compound semiconductor light emitting device.

For example, the light emitting structure may include at least one of GaN, InN, AlN, InGaN, AlGaN, InAlGaN, AlInN, AlGaAs, InGaAs, AlInGaAs, GaP, AlGaP, InGaP, AlInGaP, or InP, but the embodiment is not limited thereto.

The electrode layer 220 may include metal having high conductivity, for example, at least one of titanium (Ti), copper (Cu), nickel (Ni), gold (Au), chrome (Cr), tantalum (Ta), platinum (Pt), zinc (Sn), silver (Ag), or phosphor (P), and may include a single metal layer structure or a multi-metal layer structure.

The first electrode 221 and the second electrode 222 may have the same thickness, but the embodiment is not limited thereto.

According to the embodiment, the protective device 245 may be partially disposed on the electrode layer 220. The protective device 245 may be implemented by a thyristor, a zener diode, or a transient voltage suppression (TVS), and protect the light emitting chip 240 from ESD. The protective device 245 may be electrically connected to a connection circuit of the light emitting chip 240 to protect the light emitting chip 240.

According to the related art, the protective device mounted on the electrode together with the LED chip in order to improve ESD characteristics absorbs a part of light emitted from the LED chip so that light efficiency is lowered.

According to the embodiment, a reflective layer 230 may be formed on the protective device 245 and a wire process is performed on the reflective layer 230 to minimize light absorption caused by the protective device, so that the light extraction efficiency can be increased.

For example, in the embodiment, the protective device 245 may be disposed at a second cavity T which is formed in the package body 210. The reflective layer 230 may be disposed on the second cavity T, and may make contact with a top surface of the protective device 245.

A depth of the second cavity T according to the embodiment may be equal to or greater than a height of the protective device 245. Accordingly, the protective device 245 may not be exposed to the upper portion of the cavity T.

According to the embodiment, since a top surface of the protective device 245 is not exposed, light absorption due to the protective device 245 may be minimized so that the light extraction efficiency can be increased.

For example, the top surface of the protective device 245 may be covered with the reflective layer 230 so that the top surface of the protective device 245 may not be exposed, but the embodiment is not limited thereto.

In the embodiment, since a horizontal sectional area of the protective device 245 may be smaller than a horizontal sectional area of the reflective layer 230, the top surface of the protective device 245 may be covered with the reflective layer 230 so that the top surface of the protective device 245 may not be exposed.

In the embodiment, a step difference may be formed at the upper portion of the second cavity T so that the reflective layer 230 can be firmly mounted.

The adhesive strength between the protective device and the reflective layer can be improved by interposing the top surface of the protective device 245 and a bottom surface of the reflective layer 230.

In the embodiment, a horizontal section of the second cavity T may have a square shape, and one side of the horizontal section is in a range of about 200±20 μm. A horizontal section of the protective device 245 may also have a square shape, and one side of the horizontal section is in a range of about 180 μm, but the embodiment is not limited thereto.

In the embodiment, the reflective layer 230 may include a metallic material having high reflectance. For example, the reflective layer 230 may include a metallic layer having Ag, Al, or an alloy with Al or Ag, but the embodiment is not limited thereto.

According to the embodiment, the protecting device may be disposed inside the second cavity T and the reflective layer 230 is disposed on the protecting device 245 so that the light absorption caused by the protective device can be blocked, thereby improving the light extraction efficiency.

In the embodiment, the first electrode 221 may extend from one side of the package body 210 to an inside of the package body 210 through a first hole H1 which is formed through a top surface and a bottom surface of the package body 210.

The first electrode 221 may extend to a bottom surface of the second cavity T in which the protective device 245 is disposed, and the protective device 245 may be disposed on the first electrode 221 which is disposed at a lower portion of the second cavity T.

In the embodiment, the second electrode 222 may extend from the opposite lateral side of the package body 210 to an inside of the first cavity C formed on the package body 210 by passing through a second hole H2 which is formed through the top surface and the bottom surface of the package body 210.

In this case, the reflective layer 230 may be electrically connected to the second electrode 222 so that power may be applied to the protective device 245.

The embodiment may include a first wire 251 electrically connecting a first pad P1 of the light emitting chip 240 (see FIG. 2) to the first electrode 221, and a second wire 252 electrically connecting a second pad P2 of the light emitting chip 240 (see FIG. 2) to the second electrode 222.

According to the embodiment, the protecting device may be disposed inside the second cavity and the reflective layer is disposed on the protecting device so that the light absorption caused by the protective device can be blocked, thereby improving the light extraction efficiency.

Meanwhile, according to the related art, light emitted from an LED chip is partially absorbed into an electrode exposed on the package body so that light extraction is lowered.

In the embodiment, as shown in FIG. 2, only a first bonding pad region B of the first electrode 221 where the first wire 251 is electrically connected to the light emitting chip 240 may be exposed in the first cavity C of the package body 210.

Accordingly, since an electrode region exposed in the first cavity C of the package body 210 is only the first wire bonding pad region B, light absorption by the electrode layer may be minimized so that the light extraction efficiency can be maximized.

For example, in the embodiment, the wire bonding pad region B of the first electrode 221 is exposed and remaining regions of the first electrode 221 may not be exposed by the package body 210.

In addition, according to the embodiment, a thermal stress due to the difference in the elastic coefficient between the molding part and the electrode layer may be diminished by minimizing a contact area between the molding part 260 and the electrode layer so that the molding part may be prevented from being delaminated, thereby improving the reliability.

In the embodiment, the molding part 260 may be formed on the light emitting chip 240 to fill the first cavity C.

The molding part 260 may include a transparent resin layer such as silicon or epoxy, and may have a single layer structure or a multi-layer structure. For example, the molding part 250 may include dimethyl-based silicon, but the embodiment is not limited thereto.

A surface of the molding part 260 may have a flat shape, a concave shape, or a convex shape. For example, the surface of the molding part 260 may be a concave curved surface which may be a light emitting surface, but the embodiment is not limited thereto.

The molding part 260 may include a luminescence material for converting a wavelength of light emitted from the light emitting chip 240. The luminescence material excites the light emitted from the light emitting chip 240 to emit the light having another wavelength. The luminescence material includes one selected from the group consisting of YAG, TAG, silicate, nitride, or oxy-nitride-based material. The luminescence material may include at least one of a red luminescence material, a yellow luminescence material or a green luminescence material, but the embodiment is not limited thereto.

According to the embodiment, the protecting device may be disposed inside the second cavity and the reflective layer is disposed on the protecting device so that the light absorption caused by the protective device can be blocked, thereby improving the light extraction efficiency.

Further, according to the embodiment, since an electrode region exposed in the first cavity C of the package body 210 may be only the first wire bonding pad region B, light absorption by the electrode layer may be minimized so that the light extraction efficiency can be maximized.

In addition, according to the embodiment, a thermal stress due to the difference in the elastic coefficient between the molding part and the electrode layer may be diminished by minimizing a contact area between the molding part 260 and the electrode layer so that the molding part may be prevented from being delaminated, thereby improving the reliability.

Figure 3:
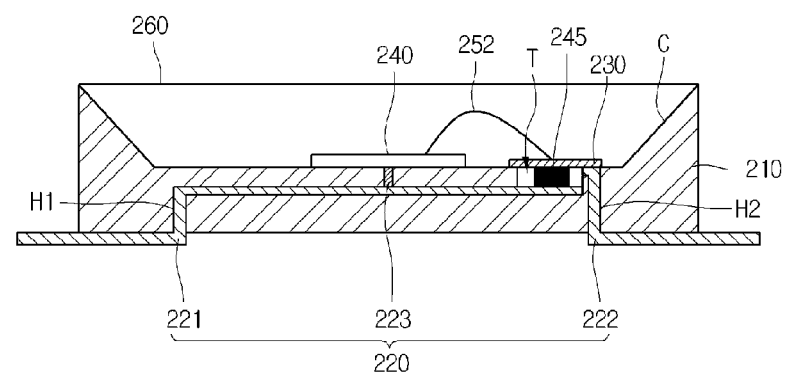
FIG. 3 is a sectional view showing another example of a light emitting device package according to the first embodiment.

FIG. 3 is a sectional view showing another example of a light emitting device package according to the first embodiment.

The light emitting device 240 illustrated in FIG. 3 may be a vertical light emitting device, but the embodiment is not limited thereto.

According to the embodiment, the electrode layer 200 may further include a third electrode 223 protruding to a bottom surface of the light emitting device 240. The third electrode 223 may protrude from a part of the top surface of the first electrode 221 to a bottom surface of the light emitting device 240, but the embodiment is not limited thereto.

Accordingly, the third electrode 223 may be electrically connected to the light emitting device 240. For example, the third electrode 223 may be electrically connected to the bottom surface of the light emitting device 240, but the embodiment is not limited thereto.

According to the embodiment, the third electrode 223 protruding to the bottom surface of the light emitting device 240 may be further provided, so the first electrode 221 may be not exposed upward in the first cavity C so that a first wire process may be not required. Thus, a pad area for a first wire and a wiring process is not required so that light loss due to the pad area may be minimized, thereby increasing the light extraction efficiency.

Figure 4:
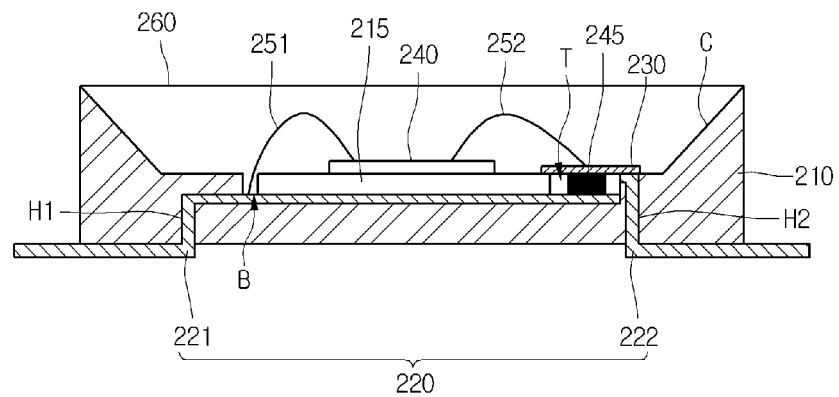
FIG. 4 is a sectional view showing a light emitting device package according to a second embodiment.

FIG. 4 is a sectional view showing a light emitting device package 202 according to a second embodiment.

The second embodiment may adopt the technical features and effects of the first embodiment.

The light emitting device package 202 according to the second embodiment may further include an insulating layer 215 between the first electrode 221 and the light emitting chip 240, and the light emitting chip 240 may be disposed on the insulating layer 215.

The insulating layer 215 may include an oxide or a nitride, but the embodiment is not limited thereto.

According to the second embodiment, a process of forming the first electrode 221 may be more easily performed, and a process of exposing a wire bonding pad area B may be more precisely performed.

Figure 5:
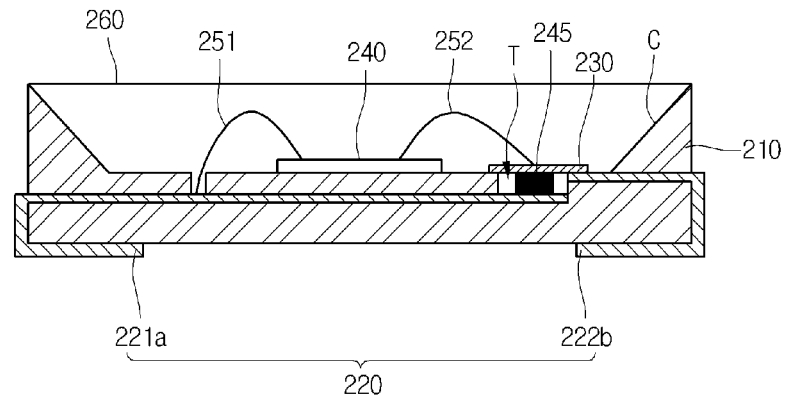
FIG. 5 is a sectional view showing a light emitting device package according to third first embodiment.

FIG. 5 is a sectional view showing a light emitting device package 203 according to third first embodiment.

The third embodiment may adopt the technical features and effects of the first embodiment.

The first electrode 221a may extend into an inside of the package body 210 by passing through one lateral side of the package body 210 while surrounding the one lateral side of the package body 210.

Further, the second electrode 222b may extend into an inside of the first cavity formed on the package body 210 by passing through the opposite lateral side of the package body 210 while surrounding the opposite lateral side of the package body 210.

According to the third embodiment, a process of forming the electrode layer 220 may be more easily performed.

Figure 6:
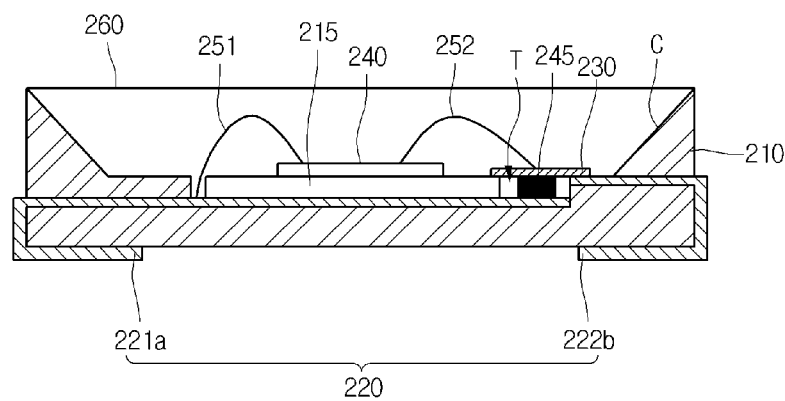
FIG. 6 is a sectional view showing a light emitting device package according to a fourth embodiment.

FIG. 6 is a sectional view showing a light emitting device package 204 according to a fourth embodiment.

The fourth embodiment may adopt the technical features and effects of the third embodiment.

The light emitting device package 204 according to the fourth embodiment may further include an insulating layer 215 between the first electrode 221 and the light emitting chip 240, and the light emitting chip 240 may be disposed on the insulating layer 215.

Accordingly, a process of forming the first electrode 221 may be more easily performed, and a process of exposing a wire bonding pad area B may be more precisely performed.

According to the light emitting device package of the embodiment, light extraction efficiency can be improved by preventing light emitted from the light emitting chip from being absorbed in the protective device and/or the electrode layer.

A plurality of light emitting device packages according to the embodiment are arrayed on a substrate, and a light guide plate, a prism sheet, a diffusion sheet and a fluorescent sheet serving as optical members may be disposed on a path of light emitted from the light emitting device packages.

Figure 7:
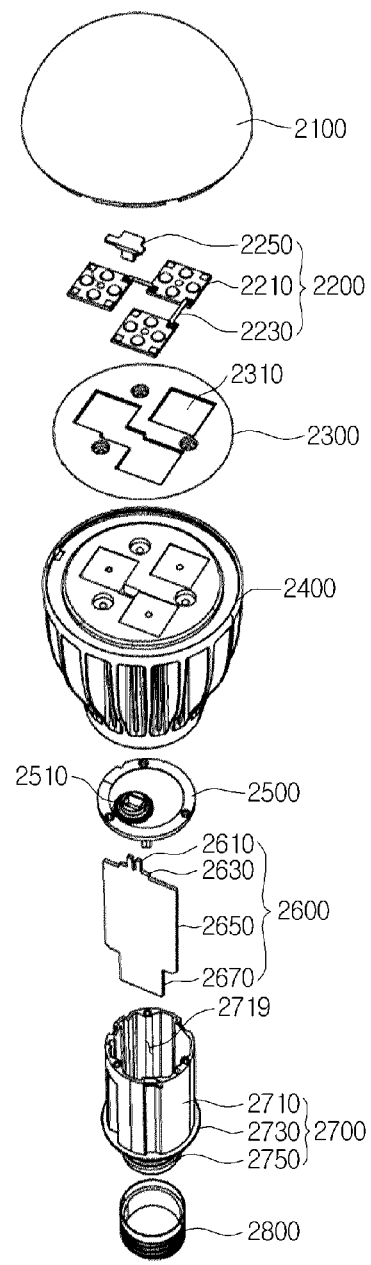
FIGS. 7 to 9 are exploded perspective views showing examples of a lighting system including a light emitting device according to the embodiment.
Figure 8:
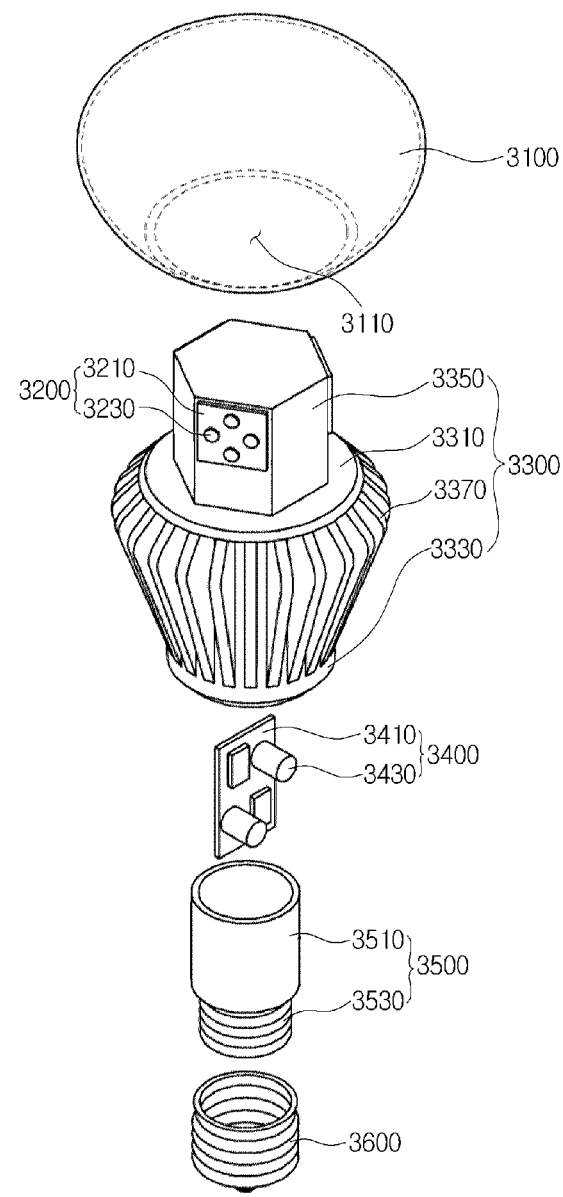
Figure 9:
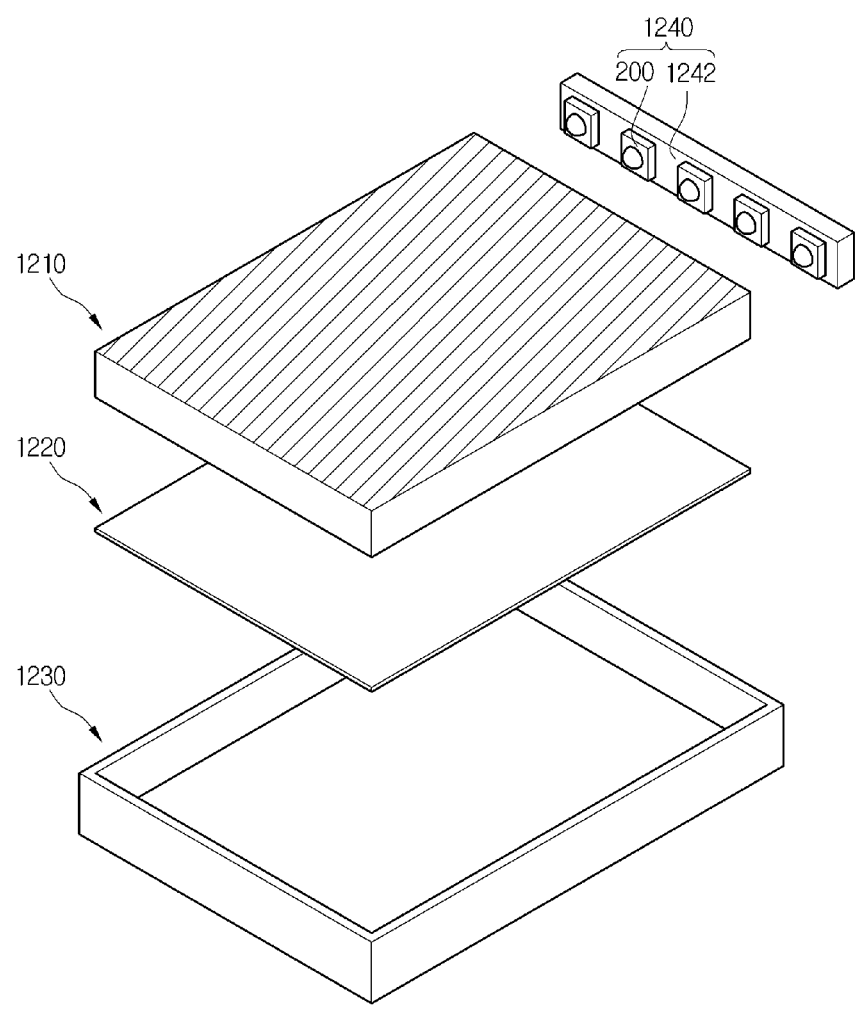

FIGS. 7 to 9 are exploded perspective views showing examples of a lighting system including a light emitting device according to the embodiment.

As shown in FIG. 7, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 3100 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a +electric wire and a −electric wire are electrically connected to the extension part 2670 and second terminals of the +electric wire and the −electric wire may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

As shown in FIG. 8, the lighting system according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a blub shape and is hollow. The cover 3100 has an opening 3110. The light source part 3200 and a member 3350 may be inserted through the opening 3110.

The cover 3100 may be coupled with the radiator 3300, and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme. The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source part may be disposed. In detail, the light source part 3200 may be disposed in at least one of a plurality of lateral sides of the member 3350. A top end of the light source part 3200 of the light source part 3200 may be disposed at the lateral side of the member 3350.

The light source part 3200 may be disposed at three of six lateral sides of the member 3350. However, the embodiment is not limited thereto, and the light source part 3200 may be disposed at all lateral sides of the member 3350. The light source part 3200 may include a substrate 3210 and a light emitting device 3230. The light emitting device 32030 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator. For example, the typical printed circuit board (PCB) may include a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a lateral side 3330. The member 3350 may be disposed on the top surface 3310 of the radiator 3310. The top surface 3310 of the radiator 3300 may be coupled with the cover 3100. The top surface of the radiator 3300 may have a shape corresponding to an opening 3110 of the cover 3100.

A plurality of heat radiation pins 3370 may be disposed at the lateral side 3330 of the radiator 3300. The heat radiation pin 3370 may extend outward from the lateral side of the radiator 3300 or may be connected to the lateral side of the radiator 3300. The heat radiation pin 3370 may improve heat radiation efficiency by increasing a heat radiation area of the radiator 3300. The lateral side 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six lateral sides. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six lateral sides of the member 3350. The light source part 3200 may be disposed at all or some of the six lateral sides of the member 3350. The light source part 3200 is disposed at three of the six lateral sides of the member 3350 in FIG. 8.

The substrate 3210 is disposed at the lateral side of the member 3350. The lateral side of the member 3350 may be substantially vertical to the top surface of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator.

The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 with the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 360 may have a screw groove structure corresponding to a thread structure of the connecting part 3550.

Further, as shown in FIG. 9, the lighting system according to the embodiment, for example, a backlight unit includes a light guide plate 1210, a light emitting module 1240 for providing the light to the light guide plate 1210, a reflective member 1220 positioned below the light guide plate 1210, and a bottom cover 1230 for receiving the light guide plate 1210, the light emitting module 1240, and the reflective member 1220 therein, but the embodiment is not limited thereto.

The light guide plate 1210 diffuses the light to provide surface light. The light guide plate 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB) as well as a typical PCB, but the embodiment is not limited thereto.

In addition, the light emitting device packages 200 are arranged on the substrate 1242 such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment relates to the light emitting device package and the lighting system.

According to the light emitting device package and the lighting system of the embodiment, light extraction efficiency can be improved by preventing light emitted from the light emitting chip from being absorbed in the protective device and/or the electrode layer.

A plurality of light emitting device packages according to the embodiment may be arrayed on the substrate and the light guide plate, the prism sheet, the diffusion sheet and the fluorescent sheet serving as optical members may be disposed on a path of light emitted from the light emitting device packages. The light emitting packages, the substrate, and the optical member may serve as the backlight unit or a lighting unit. For example, the lighting system may include the backlight unit, the lighting unit, an indicator, a lamp, or a street lamp.

The invention claimed is:

1. A light emitting device package comprising:
a package body including a first cavity;
an electrode layer including a first electrode and a second electrode that are electrically isolated from each other;
a light emitting device electrically connected to the electrode layer on the package body;
a protective device disposed in a second cavity formed at the package body and electrically connected to the electrode layer;
a reflective layer on the protective device; and
a molding part on the light emitting device,
wherein at least one of the first electrode and the second electrode is disposed on the package body,
wherein the second cavity has a shape that is concaved down from a bottom surface of the first cavity,
the reflective layer is disposed on the second cavity, and
wherein the protective device is disposed on the first electrode that is disposed at a lower portion of the second cavity.

2. The light emitting device package of claim 1, wherein a top surface of the protective device is not exposed.

3. The light emitting device package of claim 1, wherein a top surface of the protective device is covered with the reflective layer.

4. The light emitting device package of claim 1, wherein a horizontal sectional area of the protective device is smaller than a horizontal sectional area of the reflective layer.

5. A light emitting device package comprising:
a package body including a first cavity;
an electrode layer including a first electrode and a second electrode that are electrically isolated from each other;
a light emitting device electrically connected to the electrode layer on the package body;
a protective device disposed in a second cavity formed at the package body and electrically connected to the electrode layer;
a reflective layer on the protective device; and
a molding part on the light emitting device,
wherein at least one of the first electrode and the second electrode is disposed on the package body,
wherein the second cavity has a shape that is concaved down from a bottom surface of the first cavity,
the reflective layer is disposed on the second cavity, and
wherein the reflective layer is electrically connected to the second electrode so that power is applied to the protective device.

6. The light emitting device package of claim 1, wherein the reflective layer comprises a metallic material.

7. The light emitting device package of claim 1, wherein a depth of the second cavity is equal to or greater than a height of the protective device.

8. The light emitting device package of claim 7, wherein a step difference is formed at an upper portion of the second cavity.

9. The light emitting device package of claim 1, further comprising:
a first wire electrically connecting the first electrode to the light emitting device; and
a second wire electrically connecting the reflective layer to the light emitting device,
wherein the second electrode is electrically connected to the reflective layer.

10. A light emitting device package comprising:
a package body including a first cavity;
an electrode layer including a first electrode and a second electrode which are electrically isolated from each other;
a light emitting device electrically connected to the electrode layer on the package body;
a protective device disposed in a second cavity formed at the package body and electrically connected to the electrode layer;
a reflective layer on the protective device; and
a molding part on the light emitting device,
wherein the first electrode extends from one lateral side of the package body to an inside of the package body through a first hole formed through a top surface and a bottom surface of the package body; and
wherein the reflective layer contacts a top surface of the protective device,
wherein the protective device is electrically connected to the second electrode through the reflective layer, and
wherein a part of the first electrode contacts a bottom surface of the protective device.

11. The light emitting device package of claim 10, wherein the electrode layer further includes a third electrode protruding to a bottom surface of the light emitting device.

12. The light emitting device package of claim 11, wherein the third electrode is electrically connected to the light emitting device.

13. The light emitting device package of claim 11, wherein the light emitting device includes a vertical light emitting device, and
the third electrode is electrically connected to the bottom surface of the light emitting device.

14. The light emitting device package of claim 11, wherein the first electrode is not exposed upward in the first cavity.

15. The light emitting device package of claim 10, further comprising an insulating layer between the first electrode and the light emitting device.

16. The light emitting device package of claim 15, wherein the light emitting device is disposed on the insulating layer.

17. The light emitting device package of claim 10, wherein the first electrode extends to the inside of the package body by passing through one lateral side of the package body while surrounding the one lateral side of the package body.

18. The light emitting device package of claim 15, wherein the first electrode extends to the inside of the package body by passing through one lateral side of the package body while surrounding the one lateral side of the package body.

19. The light emitting device package of claim 1, wherein the reflective layer is electrically connected to the second electrode so that power is applied to the protective device.

20. The light emitting device package of claim 5, wherein the protective device is disposed on the first electrode that is disposed at a lower portion of the second cavity.

21. The light emitting device package of claim 10, further comprising:
- a first wire electrically connecting the first electrode to the light emitting device; and
- a second wire electrically connecting the reflective layer to the light emitting device,
- wherein the second electrode is electrically connected to the reflective layer.

* * * * *